(12) United States Patent
Tatsuzawa et al.

(10) Patent No.: US 7,785,708 B2
(45) Date of Patent: Aug. 31, 2010

(54) ADHESIVE FILM FOR CIRCUIT CONNECTION, AND CIRCUIT CONNECTION STRUCTURE

(75) Inventors: Takashi Tatsuzawa, Shimodate (JP); Itsuo Watanabe, Shimodate (JP); Naoki Fukushima, Shimodate (JP); Masahide Kume, Shimodate (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/029,628

(22) Filed: Jan. 6, 2005

(65) Prior Publication Data

US 2005/0151271 A1    Jul. 14, 2005

(30) Foreign Application Priority Data

Jan. 7, 2004    (JP) .......................... P2004-002326

(51) Int. Cl.
    *B32B 15/04*    (2006.01)
(52) U.S. Cl. ................... 428/356; 428/355 N; 174/259; 252/512; 252/514; 257/788
(58) Field of Classification Search .............. 257/779, 257/737, 738, 778, 788; 428/209, 901, 356, 428/355 N; 252/512, 514; 174/259
    See application file for complete search history.

(56) References Cited

U.S. PATENT DOCUMENTS

| | | | | |
|---|---|---|---|---|
| 4,157,932 A | * | 6/1979 | Hirata .......................... | 156/310 |
| 5,001,542 A | * | 3/1991 | Tsukagoshi et al. .......... | 257/746 |
| 5,120,665 A | * | 6/1992 | Tsukagoshi et al. ........... | 156/64 |
| 5,431,571 A | * | 7/1995 | Hanrahan et al. ............. | 439/91 |
| 5,672,400 A | * | 9/1997 | Hansen et al. ............. | 428/40.1 |
| 5,783,465 A | * | 7/1998 | Canning et al. ............. | 438/119 |
| 5,903,056 A | * | 5/1999 | Canning et al. ............. | 257/773 |
| 5,965,064 A | * | 10/1999 | Yamada et al. .............. | 252/512 |
| 6,337,522 B1 | * | 1/2002 | Kang et al. .................. | 257/784 |
| 6,369,451 B2 | * | 4/2002 | Lin ............................ | 257/779 |
| 6,426,021 B2 | * | 7/2002 | Suga et al. ................... | 252/513 |
| 6,429,382 B1 | * | 8/2002 | Amami et al. .............. | 174/259 |
| 6,576,334 B2 | * | 6/2003 | Sakairi ....................... | 428/323 |
| 6,733,613 B2 | * | 5/2004 | Khanna .................... | 156/272.4 |

(Continued)

FOREIGN PATENT DOCUMENTS

JP    2002-164389 A    6/2002

(Continued)

OTHER PUBLICATIONS

US Office Action dated Sep. 4, 2008, issued in corresponding U.S. Appl. No. 11/976,506.

(Continued)

*Primary Examiner*—Cathy Lam
(74) *Attorney, Agent, or Firm*—Westerman, Hattori, Daniels & Adrian, LLP (57) ABSTRACT

The present invention provides an adhesive film for circuit connection which is to be interposed between circuit electrodes facing each other and used for electrically connecting the circuit electrodes to each other, which comprises a curing agent to generate free radicals with heating, a radically polymerizable substance, and a film-forming polymer, and in which a temporary fixing power to a flexible substrate having the circuit electrode is 40-180 N/m.

24 Claims, 3 Drawing Sheets

U.S. PATENT DOCUMENTS

| | | |
|---|---|---|
| 6,777,464 B1 | 8/2004 | Watanabe et al. |
| 6,833,180 B1 * | 12/2004 | Kodemura .................. 428/220 |
| 6,841,628 B2 * | 1/2005 | Oota et al. .................. 525/403 |
| 6,939,913 B1 * | 9/2005 | Arifuku et al. ............... 524/730 |

FOREIGN PATENT DOCUMENTS

| | | |
|---|---|---|
| JP | 2002-167556 A | 6/2002 |
| JP | 2002-203427 A | 7/2002 |
| JP | 3344886 | 8/2002 |
| JP | 2003-45415 A | 2/2003 |
| JP | 2003-64322 | 3/2003 |
| JP | 2003-64331 A | 3/2003 |
| JP | 2003-193020 A | 7/2003 |
| JP | 2003-198119 A | 7/2003 |
| JP | 2003-323813 A | 11/2003 |
| JP | 3587859 | 8/2004 |
| WO | 01/14484 A1 | 3/2001 |
| WO | 01/15505 A1 | 3/2001 |
| WO | 01/82363 A1 | 11/2001 |

OTHER PUBLICATIONS

Japanese Office Action dated May 25, 2010, issued in corresponding Japanese Patent Application No. 2004-002326.

* cited by examiner

ADHESIVE FILM FOR CIRCUIT CONNECTION, AND CIRCUIT CONNECTION STRUCTURE

BACKGROUND OF THE INVENTION

1. Field of the Invention

The present invention relates to an adhesive film for circuit connection, and a circuit connection structure.

2. Related Background Art

Circuit-connection films for electrically connecting mutually opposed circuit electrodes, e.g., anisotropic conductive adhesive films in which electrically conductive particles are dispersed in an epoxy type adhesive (epoxy resin base anisotropic conductive adhesive films) are commonly used for electrical connection mainly between a TCP (Tape Carrier Package) equipped with a semiconductor chip for driving a liquid crystal display (LCD; Liquid Crystal Display), and an LCD panel, or between a TCP and a printed circuit board.

In recent years, even in cases where a semiconductor chip is mounted directly on an LCD panel or on a printed circuit board by face down bonding, the flip chip packaging advantageous for thickness reduction and narrow pitch connection is adopted instead of the conventional wire bonding method, and the anisotropic conductive adhesive films are also used as circuit-connection adhesive films in this packaging.

However, the aforementioned epoxy resin base anisotropic conductive adhesive films had excellent workability but required heating at about 160-180° C. for the connection time of about 20 seconds and heating at about 180-210° C. for 10 seconds.

The reason for the need for such heating is that a catalyst curing agent inactive at ordinary temperature is used for the purpose of achieving good stability through simultaneous achievement of short-time curability (fast curability) and storage stability (shelf life) and it results in failing to achieve sufficient reaction during curing.

With recent trends toward larger scale and narrower frame of LCD modules, there arise problems of increase of thermal influence on the LCD panel and increase of warpage of the printed board in a connection operation with use of the circuit-connection adhesive film. There are also studies on replacement of the glass LCD panel substrate with a plastic one in terms of weight reduction, but the plastic materials have the problem of low thermal resistance to make mounting of the TCP difficult.

There are thus demands for low-temperature connection of the circuit-connection adhesive film as countermeasures to such problems. In addition, low-temperature fast curability is necessary and indispensable in order to meet needs for reduction of the connection time to below 10 seconds to increase production efficiency. For this reason, there are proposals of circuit-connection adhesive films with a radically polymerizable substance capable of achieving connection by heating at about 160° C. for the connection time of 10 seconds (e.g., Japanese Patent No. 3344886).

SUMMARY OF THE INVENTION

The Inventors found that the foregoing circuit-connection adhesive films with the radically polymerizable substance had the problem of poor connection processability; for example, in a pre-bonding process of transferring the circuit-connection adhesive film onto circuit electrodes of a substrate, the film failed to be accurately transferred onto the circuit electrodes of the substrate; or, after a process of temporarily fixing a circuit member to be connected, to the circuit-connection adhesive film, the circuit member peels off the circuit-connection adhesive film because of vibration during transportation to a main bonding process.

An object of the present invention is to provide an adhesive film for circuit connection and a circuit connection structure with excellent connection processability during connection between circuit members.

In order to achieve the above object, the present invention provides an adhesive film for circuit connection, which is to be interposed between circuit electrodes facing each other and used for electrically connecting the circuit electrodes to each other, the adhesive film comprising a curing agent to generate free radicals with heating, a radically polymerizable substance, and a film-forming polymer, wherein a temporary fixing power to a flexible substrate having the circuit electrode is 40-180 N/m.

This adhesive film for circuit connection has excellent connection processability in connecting circuit electrodes of circuit members to each other. Specifically, an improvement is made in transferability onto a flexible substrate as a circuit member. In addition, a flexible substrate as a circuit member becomes unlikely to drop with vibration during transportation to a next process. Furthermore, after a process of transferring the adhesive film for circuit connection onto a flexible substrate, the circuit-connection adhesive film becomes unlikely to peel off a base film (also called a strippable support film) normally used as bonded to the circuit-connection adhesive film. Yet furthermore, even if the circuit-connection adhesive film several ten meters or more long is wound around a reel and kept still at room temperature for a long time, back transfer of the circuit-connection adhesive film onto the base film is adequately prevented. Thus it well overcomes the problem that the circuit-connection adhesive film cannot be drawn out of the reel.

If the temporary fixing power is lower than 40 N/m, tackiness will be too weak; after a process of temporarily fixing a flexible substrate to the circuit-connection adhesive film, the flexible substrate becomes likely to drop with vibration during the transportation to the next process, thus degrading the connection processability, or productivity. On the other hand, if the temporary fixing power of the adhesive film is larger than 180 N/m, tackiness will be too strong; after a process of transferring the adhesive film onto a flexible substrate, the adhesive film will hardly peel off the base film, similarly causing a problem of reduction of productivity. In addition, the too strong tackiness will cause a problem that, where the circuit-connection adhesive film several ten meters or more long is wound around a reel and kept still at room temperature for a long time, the circuit-connection adhesive film is back-transferred onto the base film and the desired circuit-connection adhesive film cannot be drawn out of the reel.

A circuit connection structure of the present invention is obtained as follows: at least one of a first circuit member having a first circuit electrode and a second circuit member having a second circuit electrode is a flexible substrate; the aforementioned adhesive film for circuit connection is temporarily fixed to the flexible substrate; the first circuit member and the second circuit member are placed in a state in which the first circuit electrode and the second circuit electrode face each other; the circuit-connection adhesive film is interposed between the first circuit electrode and the second circuit electrode placed in the facing state; the circuit-connection adhesive film is heated and pressed to electrically connect the first circuit electrode and the second circuit electrode to each other.

The present invention also provides a circuit connection structure comprising a first circuit member in which a first circuit electrode is formed on a first circuit substrate; a second circuit member in which a second circuit electrode is formed on a second circuit substrate; and a circuit connection member placed between the first circuit electrode and the second circuit electrode and connecting the first and second circuit members to each other, wherein the circuit connection member is comprised of a cured product of the aforementioned adhesive film for circuit connection and wherein the first circuit electrode and the second circuit electrode are electrically connected through the circuit connection member.

In these circuit connection structures, the adhesive film provides excellent connection processability in connecting the circuit members to each other. For this reason, it becomes feasible to increase productivity and to reduce the cost of the circuit connection structure.

DESCRIPTION OF THE PREFERRED EMBODIMENTS

An adhesive film for circuit connection according to the present invention will be described below.

The adhesive film for circuit connection according to the present invention is a circuit-connection adhesive film which is to be interposed between circuit electrodes facing each other and used for electrically connecting the circuit electrodes to each other, the adhesive film comprising a curing agent to generate free radicals with heating, a radically polymerizable substance, and a film-forming polymer, wherein a temporary fixing power to a flexible substrate having the circuit electrode is 40-180 N/m.

This circuit-connection adhesive film has excellent connection processability to a flexible substrate being a circuit member. Specifically, an improvement is made in transferability to the flexible substrate with circuit electrodes. In addition, the flexible substrate becomes unlikely to drop with vibration during transportation to the next process. Furthermore, after the process of transferring the circuit-connection adhesive film onto the flexible substrate, the circuit-connection adhesive film becomes unlikely to peel off the base film. Yet furthermore, even in the case where the circuit-connection adhesive film several ten meters or more long is wound around a reel and kept still at room temperature for a long time, the back transfer of the circuit-connection adhesive film onto the base film is adequately prevented to well overcome the problem that the desired circuit-connection adhesive film cannot be drawn out of the reel.

If the temporary fixing power is lower than 40 N/m, tackiness will be too weak; after a process of temporarily fixing a flexible substrate to the circuit-connection adhesive film, the flexible substrate becomes likely to drop with vibration during the transportation to the next process, thus degrading the connection processability, or productivity. On the other hand, if the temporary fixing power of the adhesive film is larger than 180 N/m, tackiness will be too strong; after a process of transferring the adhesive film onto a flexible substrate, the adhesive film will hardly peel off the base film, similarly causing a problem of reduction of productivity. In addition, the too strong adherence will likely cause a problem that, where the circuit-connection adhesive film several ten meters or more long is wound around a reel and kept still at room temperature for a long time, the circuit-connection adhesive film is back-transferred onto the base film and the desired circuit-connection adhesive film cannot be drawn out of the reel.

A sample for measuring the temporary fixing power of the circuit-connection adhesive film of the present invention is prepared as follows. Namely, a circuit-connection adhesive film with a PET base 2.5 mm wide is first pre-bonded under the conditions of 70° C., 1 MPa, and 3 s onto an ITO-coated glass (surface resistance: 15-20Ω/□; thickness: 1.1 mm) substrate; thereafter the PET base is peeled off; a 200 μm pitch flexible circuit board (18 μm Cu foil, plated with Sn) with the base of a 75 μm-thick polyimide film is bonded under the conditions of 20-24° C., 0.5 MPa, and 5 s onto the circuit-connection adhesive film to prepare the sample for temporary fixing.

The measurement of the temporary fixing power is carried out as follows. Namely, using the sample prepared as described above, a bond strength (per cm in width) between the 200 μm pitch flexible printed circuit board (FPC) and the circuit-connection adhesive film is measured (at the measurement temperature of 23±2° C.) by peeling in the tensile direction of 90° (at the tensile speed: 50 mm/min) (peeling in the parallel direction to circuits of FPC), and the bond strength measured at this time is defined as a temporary fixing power (N/m).

A particularly preferred range of the temporary fixing power of the circuit-connection adhesive film according to the present invention is 60 N/m-150 N/m.

The curing agent to generate free radicals with heating, which is applicable in the present invention, is an agent that is decomposed with heating to generate free radicals, and there are no particular restrictions on the curing agent as long as it, together with the radically polymerizable substance and the film-forming polymer, can achieve the temporary fixing power of 40-180 N/m of the circuit-connection adhesive film to the flexible substrate. Examples of the curing agent include curing agents such as peroxides and azo compounds The curing agent is properly selected according to a target connection temperature, a target connection time, a target pot life, and so on. Among the aforementioned peroxides, in terms of high reactivity and pot life, it is preferable to use an organic peroxide whose temperature for the half-life of ten hours is not less than 40° C. and whose temperature for the half-life of one minute is not more than 180° C. In this case, a content of the organic peroxide mixed is preferably 0.05-10% by weight and more preferably 0.1-5% by weight. If the content of the organic peroxide is less than 0.05% by weight, the organic peroxide becomes less reactive, when compared with the case where the content is not less than 0.05% by weight. On the other hand, if the content of the organic peroxide exceeds 10% by weight, the stability of preservation becomes lower, when compared with the case where the content is not more than 10% by weight. Specifically, the curing agent can be selected from diacyl peroxides, peroxydicarbonates, peroxyesters, peroxyketals, dialkylperoxides, hydroperoxides, and so on. In order to suppress corrosion of circuit electrodes of circuit members, the curing agent is preferably selected from peroxyesters, dialkylperoxides, and hydroperoxides, and is more preferably selected from peroxyesters to provide high reactivity.

Examples of the diacyl peroxides include isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoyl peroxytoluene, benzoyl peroxide, and so on.

Examples of the peroxydicarbonates include di-n-propyl peroxydicarbonate, diisopropyl peroxydicarbonate, bis(4-t-butylcyclohexyl)peroxydicarbonate, di-2-ethoxymethoxyperoxydicarbonate, di(2-ethylhexylperoxy)dicarbonate, dimethoxybutyl peroxydicarbonate, di(3-methyl-3-methoxybutylperoxy)dicarbonate, and so on.

Examples of the peroxyesters include cumyl peroxyneodecanoate, 1,1,3,3-tetramethylbutyl peroxyneodecanoate, 1-cyclohexyl-1-methylethyl peroxynoedecanoate, t-hexyl peroxyneodecanoate, t-butyl peroxypivarate, 1,1,3,3-tetramethylbutyl peroxy-2-ethylhexanoate, 2,5-dimethyl-2,5-bis(2-ethylhexanoylperoxy)hexane, 1-cyclohexyl-1-methylethyl peroxy-2-ethylhexanoate, t-hexyl peroxy-2-ethylhexanoate, t-butyl peroxy-2-ethylhexanoate, t-butyl peroxyisobutyrate, 1,1-bis(t-butylperoxy)cyclohexane, t-hexyl peroxyisopropylmonocarbonate, t-butyl peroxy-3,5,5-trimethylhexanoate, t-butyl peroxylaurate, 2,5-dimethyl-2,5-bis(m-toluoylperoxy)hexane, t-butyl peroxyisopropylmonocarbonate, t-butyl peroxy-2-ethylhexylmonocarbonate, t-hexyl peroxybenzoate, t-butyl peroxyacetate, and so on.

Examples of the peroxyketals include 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, 2,2-bis(t-butylperoxy)decane, and so on.

Examples of the dialkyl peroxides include α, α'-bis(t-butylperoxy)diisopropylbenzene, dicumyl peroxide, 2,5-dimethyl-2,5-di(t-butylperoxy)hexane, t-butylcumyl peroxide, and so on.

Examples of the hydroperoxides include diisopropylbenzene hydroperoxide, cumene hydroperoxide, and so on. These free radical generators may be used alone or in combination and may also be used as mixed with a decomposition accelerator or inhibitor, or the like.

The radically polymerizable substance used in the present invention is a substance having a functional group capable of undergoing radical polymerization, and the radically polymerizable substance can be selected from acrylates, methacrylates, maleimide compounds, and so on.

Specific examples of the acrylates (methacrylates) include urethane acrylate, methyl acrylate, ethyl acrylate, isopropyl acrylate, isobutyl acrylate, ethylene glycol diacrylate, diethylene glycol diacrylate, triethylene glycol diacrylate, trimethylolpropane triacrylate, tetramethylolmethane tetraacrylate, 2-hydroxy-1,3-diacryloxypropane, 2,2-bis[4-(acryloxymethoxy)phenyl]propane, 2,2-bis[4-(acryloxypolyethoxy)phenyl]propane, dicyclopentenyl acrylate, tricyclodecanyl acrylate, tris(acryloxyethyl)isocyanurate, ε-caprolactone-modified tris(acryloxyethyl)isocyanurate, tris(acryloxyethyl)isocyanurate, and so on.

The maleimide compounds are those having at least two maleimide groups in their molecule, and examples thereof include 1-methyl-2,4-bismaleimide benzene, N,N'-m-phenylenebismaleimide, N,N'-p-phenylenebismaleimide, N,N'-m-toluylenebismaleimide, N,N'-4,4-biphenylenebismaleimide, N,N'-4,4-(3,3'-dimethyl-biphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-4,4-diphenyl ether bismaleimide, N,N'-3,3'-diphenyl sulfone bismaleimide, 2,2-bis[4-(4-maleimidophenoxy)phenyl]propane, 2,2-bis[3-s-butyl-4,8(4-maleimidophenoxy)phenyl]propane, 1,1-bis[4-(4-maleimidophenoxy)phenyl]decane, 4,4'-cyclohexylidene-bis[1-(4-maleimidophenoxy)-2-cyclo hexyl)benzene, 2,2-bis[4-(4-maleimidophenoxy)phenyl]hexafluoropropane, and so on. These may be used alone or in combination and may be used together with an allyl compound, such as allylphenol, allylphenyl ether, or allyl benzoate.

In the present invention, the radically polymerizable substances as described above may be used alone or in combination, and the adhesive film of the present invention preferably contains at least a radically polymerizable substance having the viscosity at 25° C. in the range of 100,000-1,000,000 mPa·s and particularly preferably contains a radically polymerizable substance having the viscosity (25° C.) of 100,000-500,000 mPa·s. The viscosity of the radically polymerizable substance can be measured with a commercially available E-type viscometer. If the viscosity at 25° C. is less than 100,000 mPa·s, the adhension becomes too high, or a part of the adhesive film protrudes when it is formed in a tape-like form when compared with the case where the viscosity is not less than 100,000 mPa·s. If the viscosity at 25° C. exceeds 1,000,000 mPa·s, the adhesive film looses flexibility, thereby making a slit process difficult, when compared with the case where the viscosity is not more than 1,000,000 mPa·s.

Among the radically polymerizable substances urethane acrylate or urethane methacrylate is preferably applicable in terms of adhesion and it is particularly preferable to use them in combination with a radically polymerizable substance exhibiting Tg of not less than 100° C. singly after crosslinked with an organic peroxide used for improvement in heat resistance.

The radically polymerizable substance used in the present invention can be one having a dicyclopentenyl group and/or a tricyclodecanyl group and/or a triazine ring. It is particularly preferable to use a radically polymerizable substance having a tricyclodecanyl group, because heat resistance improves more sufficiently. Furthermore, the radically polymerizable substance having a tricyclodecanyl group is preferably an acrylate or a methacrylate. The adhesive film for circuit connection according to the present invention may optionally contain a polymerization inhibitor such as hydroquinone or hydroquinone methyl ethers as occasion may demand.

The radically polymerizable substance used in the present invention preferably has a triazine ring.

Furthermore, the radically polymerizable substance having the phosphate structure is preferably used in the amount of 0.1-10 parts by weight, relative to 100 parts by weight of the sum of film-forming polymer and radically polymerizable substance, and more preferably in the amount of 0.5-5 parts by weight. In this case, bond strength is improved on inorganic surfaces such as metal. The radically polymerizable substance having the phosphate structure is obtained as a reaction product of anhydrous phosphoric acid and 2-hydroxyl (meth)acrylate. Specific examples of the radically polymerizable substance having the phosphate structure include 2-methacryloyloxy ethyl acid phosphate, 2-acryloyloxy ethyl acid phosphate, and so on. These may be used alone or in combination.

The film-forming polymer used in the present invention can be selected from polystyrene, polyethylene, polyvinyl butyral, polyvinyl formal, polyimide, polyamide, polyester, polyvinyl chloride, polyphenylene oxide, urea resin, melamine resin, phenol resin, xylene resin, epoxy resin, polyisocyanate resin, phenoxy resin, polyimide resin, and so on, among which a resin having a functional group such as hydroxyl is more preferably applicable in order to improve adhesion. It is also possible to use these polymers modified with a radically polymerizable functional group. A molecular weight of these polymers is preferably 10,000-1,000,000. If the molecular weight is less than 10,000, a film-forming ability becomes lower; if the molecular weight exceeds 1,000,000, the mixing property will degrade.

The film-forming polymer is preferably included in the amount of 80-180 parts by weight relative to 100 parts by weight of the radically substance. If the amount of the film-polymerizable forming polymer is less than 80 parts by weight, the film-forming ability becomes lower, when compared with the case where the amount of the film-forming polymer is not less than 80 parts by weight. If the amount of the film-forming polymer exceeds 180 parts by weight, the film-forming polymer becomes more difficult to mix with the radically polymerizable substance and the like, when compared with the case where the amount of the film-forming polymer is not more than 180 parts by weight.

Furthermore, the circuit-connection adhesive film of the present invention may also contain a filler, a softener, a promoter, an antioxidant, a coloring agent, a flame retardant, a thixotropic agent, and/or a coupling agent, and contain phenol resin, melamine resin, isocyanates, and so on.

The circuit-connection adhesive film of the present invention preferably contains a filler, because it improves connection reliability or the like. The filler can be used if the maximum size thereof is less than the particle sizes of the conductive particles, and is preferably contained in the range of 5-60% by volume. If the amount of the filler is less than 5% by volume, the reliability of the electrical continuity becomes lower, when compared with the case where the amount is not less than 5% by volume. If the amount exceeds 60% by volume, the effect of improvement in reliability will saturate, when compared with the case where the amount is not more than 60% by volume. The coupling agent is preferably an agent containing any of a vinyl group, an acrylic group, an amino group, an epoxy group, and an isocyanate group, in terms of improvement in adhesion.

The circuit-connection adhesive film of the present invention preferably further contains electrically conductive particles. In this case, where the circuit-connection adhesive film is used for connection between circuit members, the connection reliability between circuit electrodes can be more improved, in comparison with the case where the circuit-connection adhesive film without conductive particles is used. The conductive particles can be selected from metal particles of Au, Ag, Ni, Cu, solder, or the like, carbon particles, and so on, and, in order to obtain a satisfactory pot life, the surface layer of the particles is preferably Au, Ag, or a noble metal element of the platinum group and more preferably Au, instead of the transition metals such as Ni and Cu. The conductive particles may also be those obtained by coating the surface of the transition metals such as Ni with one of the noble metals such as Au. The conductive particles may be preferably plastic-core particles obtained by forming the aforementioned conductive layer on a non-conductive material of glass, ceramics, plastics, or the like by coating or the like and forming the outermost layer of a noble metal thereon, or thermally melting metal particles, because they are deformable with application of heat and pressure so as to increase the contact area with electrodes during connection, thereby improving reliability. The thickness of the coating layer of the noble metal is preferably not less than 100 Å, in order to achieve good resistance. However, in cases where the layer of the noble metal is provided on the transition metal such as Ni, the thickness of the coating layer is preferably not less than 300 Å, because free radicals are produced by redox action induced by deficiency of the noble metal layer, deficiency of the noble metal layer occurring during mixing and dispersing of the conductive particles, or the like, so as to cause reduction of the pot life. The conductive particles are to be properly used according to applications, within the range of 0.1 to 30% by volume relative to 100% by volume of the adhesive component. The amount of the conductive particles is more preferably within the range of 0.1-10% by volume in order to prevent a short circuit between adjoining circuits or the like due to excess conductive particles.

If the circuit-connection adhesive film of this configuration is formed of two or more separate layers, including a layer containing the curing agent to generate free radicals and a layer containing the conductive particles, an improvement in the pot life is achieved in addition to the conventional effect of enabling increase of pattern density.

Next, an embodiment of the circuit connection structure of the present invention will be described with reference to FIG. 1.

Figure 1:
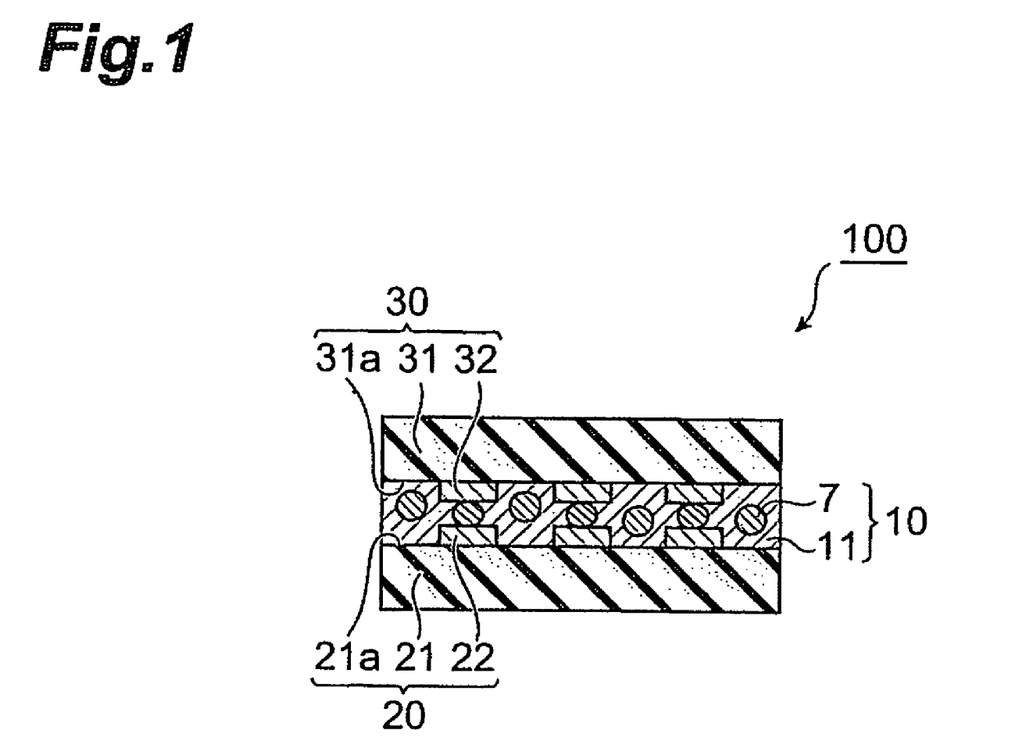
FIG. 1 is a sectional view showing an embodiment of the circuit connection structure according to the present invention.

FIG. 1 is a sectional view showing the preferred embodiment of the circuit connection structure of the present invention As shown in FIG. 1, the circuit connection structure 100 of the present embodiment has a first circuit member 20, a second circuit member 30, and a circuit connection member 10 disposed between the first circuit member 20 and the second circuit member 30. The first circuit member 20 has a first circuit substrate 21, and first circuit electrodes 22 provided on one surface 21a of the first circuit substrate 21. The second circuit member 30 has a second circuit substrate 31, and second circuit electrodes 32 provided on one surface 31a of the second circuit substrate 31. On the other hand, the circuit connection member 10 connects the first circuit member 20 to the second circuit member 30 and contains a cured material 11. Here the circuit connection member 10 is obtained by performing a curing process of heating and pressing the circuit-connection adhesive film. Namely, the circuit connection member 10 is a cured product of the circuit-connection adhesive film. The circuit connection member 10 may contain electrically conductive particles 7.

The circuit connection structure 100 of the present embodiment is obtained by a production method described below.

Figure 2:
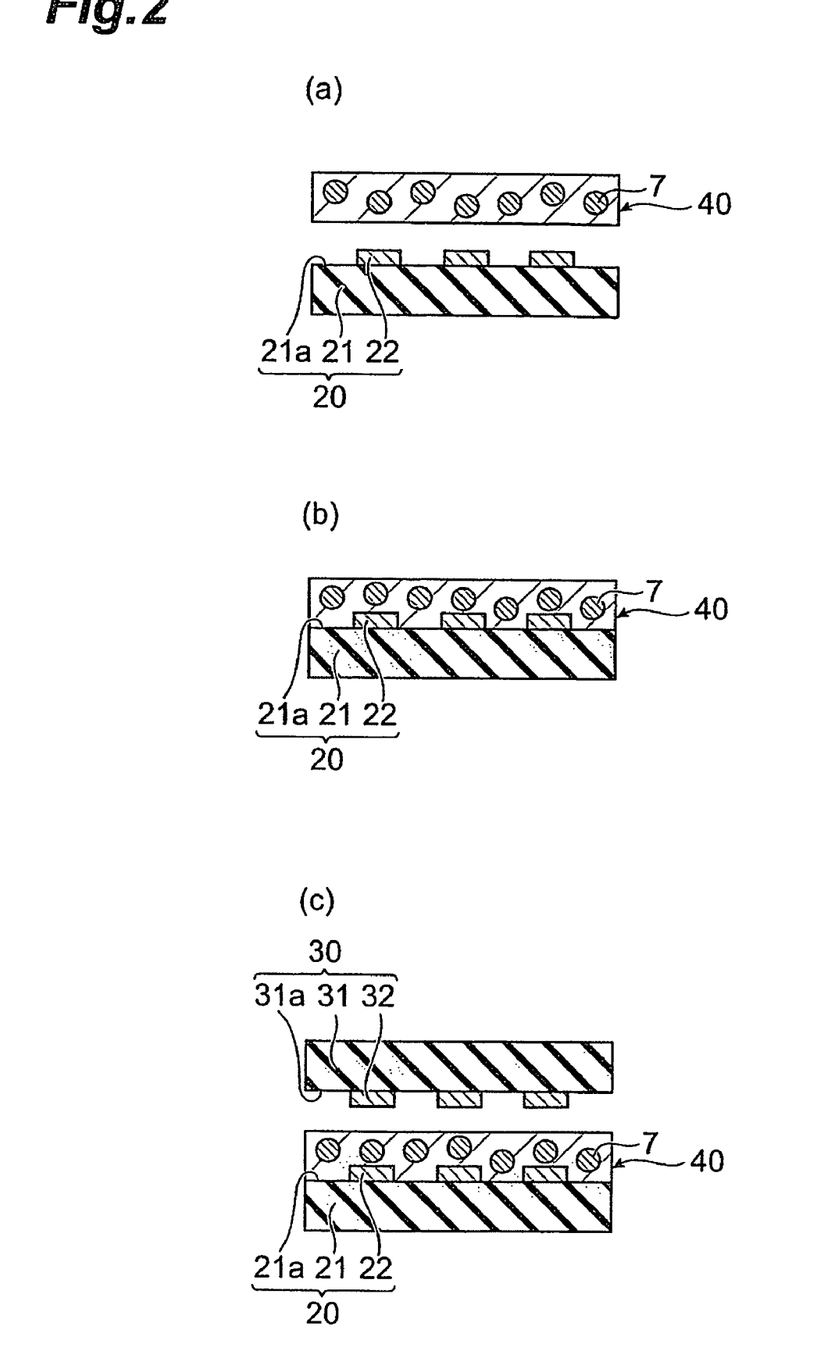
FIG. 2 is a step diagram showing a series of production steps of the circuit connection structure of FIG. 1.

Specifically, as shown in (a) in FIG. 2, the first step is to prepare the first circuit member 20 with the first circuit electrodes 22 and the second circuit member 30 with the second circuit electrodes 32. In this step, for example, the first circuit member 20 is a flexible substrate. The second circuit member 30 is not shown in (a), but is shown in (c).

Then the circuit-connection adhesive film 40 is transferred onto the first circuit member 20 to be temporarily fixed. The circuit-connection adhesive film 40 is comprised of the aforementioned circuit-connection adhesive film. In the present embodiment, the circuit-connection adhesive film 40 is composed, for example, of one layer, and contains the aforementioned curing agent, the aforementioned radically polymerizable substance, the aforementioned film-forming polymer, and the conductive particles 7. In this step, the circuit-connection adhesive film 40 is drawn out from a state in which it is wound around a reel.

Then the first circuit member 20 in the state in which the circuit-connection adhesive film 40 is temporarily fixed thereon (cf. (b) in FIG. 2) is transported to a place for connection between the first circuit member 20 and the second circuit member 30.

Then, as shown in (c) in FIG. 2, the first circuit member 20 and the second circuit member 30 are placed in a state in which the first circuit electrodes 22 and the second circuit electrodes 32 face each other, and the aforementioned circuit-connection adhesive film 40 is interposed between the first circuit electrodes 22 and the second circuit electrodes 32 placed in the facing state. Subsequently, the circuit-connection adhesive film 40 is heated and pressed to effect the curing process. In this manner the circuit connection member 10 is formed between the first and second circuit members 20, 30. The curing process can be performed by an ordinary method and the method is properly selected depending upon the adhesive composition. In this manner the first circuit electrodes 22 and the second circuit electrodes 32 are electrically connected.

In the circuit connection structure 100 obtained by the above production method, the adhesive film 40 has excellent connection processability with the first circuit member 20 of the flexible substrate. Specifically, an improvement is made in transferability onto the first circuit member 20 of the flexible substrate. In addition, the flexible substrate becomes unlikely to drop with vibration during the transportation to the next process. Furthermore, after the process of transferring the circuit-connection adhesive film 10 onto the first circuit member 20 of the flexible board, the circuit-connection adhesive film 10 becomes unlikely to peel off the base film. Yet furthermore, even if the circuit-connection adhesive film 10 several ten meters or more long is wound around a reel and kept still at room temperature for a long time, the back transfer of the circuit-connection adhesive film 10 onto the base film is fully prevented, so as to well overcome the problem of failure in drawing the desired circuit-connection adhesive film out of the reel. This makes it feasible to improve productivity and to achieve reduction of cost for the circuit connection structure 100.

In the above production method of the circuit connection structure 100, the first circuit member 20 is the flexible substrate, but the second circuit member 30 may be formed as a flexible substrate instead of the first circuit member 20, or the first circuit member 20 and the second circuit member 30 both may be formed as flexible substrates.

Figure 3:
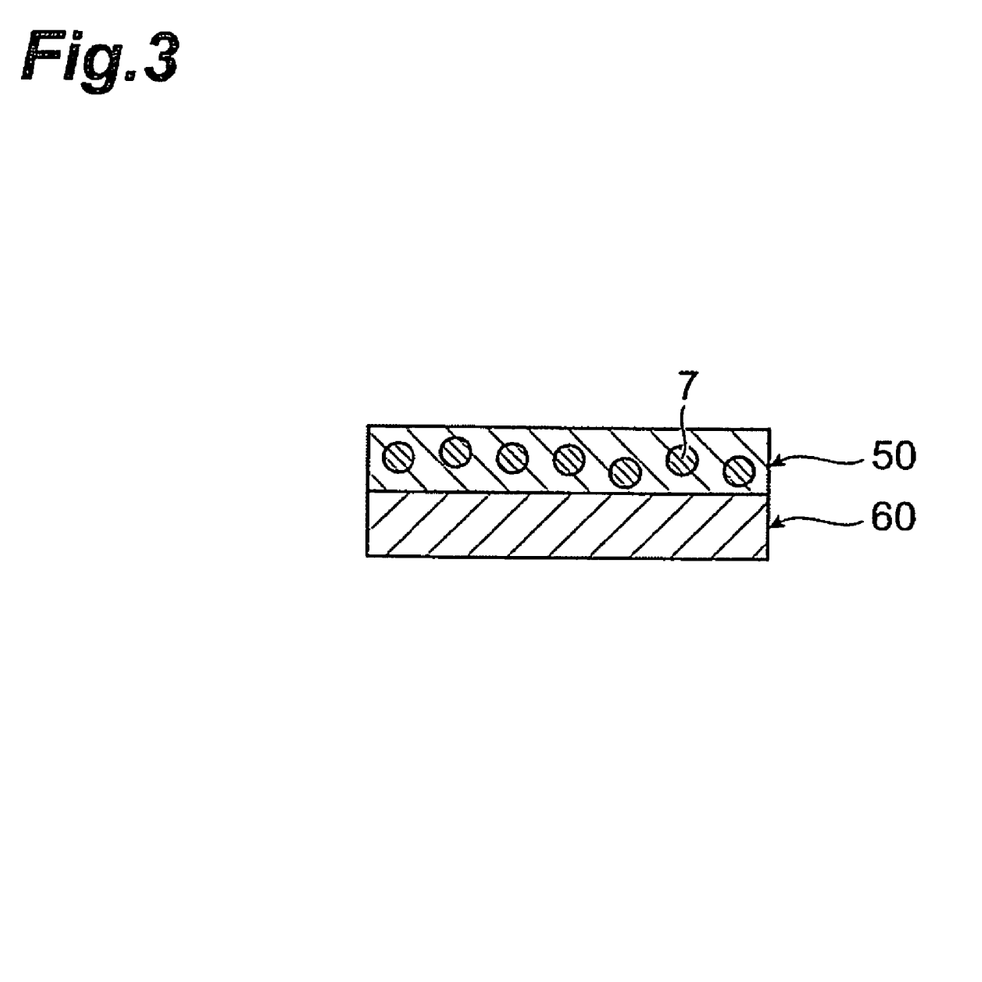
FIG. 3 is a sectional view schematically showing an embodiment of the adhesive film for circuit connection according to the present invention.

In the above embodiment, the circuit-connection adhesive film 40 is comprised of one layer and the one layer contains the curing agent, the radically polymerizable substance, the film-forming polymer, and the conductive particles 7; however, the circuit-connection adhesive film of the present invention may be comprised of a first layer 50 containing the conductive particles 7, and a second layer 60 containing the curing agent to generate free radicals, as shown in FIG. 3. In this case, it becomes feasible to achieve increase of pattern density and improvement in the pot life. The circuit-connection adhesive film may be comprised of two or more layers.

EXAMPLES

The present invention will be described below in more detail on the basis of examples.

Example 1

Mixed into 130 parts by weight of a solution containing 40% by weight of a phenoxy resin (weight-average molecular weight: 45,000) dissolved in a 50:50 mixed solvent of toluene and ethyl acetate were 10 parts by weight of urethane acrylate having the viscosity at 25° C. of 250,000 mPa·s, 25 parts by weight of bis(acryloxyethyl) isocyanurate having the viscosity at 25° C. of 8,000 mPa·s, 10 parts by weight of dimethylol tricyclodecane diacrylate having the viscosity at 25° C. of 150 mPa·s, and 3 parts by weight of 2-methacryloyloxy ethyl acid phosphate as the radically polymerizable substance, and 4 parts by weight of a hydrocarbon-diluted solution containing 50% by weight of 2,5-dimethyl-2,5-bis(2-ethylhexanoylperoxy)hexane as a free radical generator. Thereafter, this mixture was uniformly stirred. Furthermore, mixed and dispersed in this mixture was 3% by volume of conductive particles with the average particle size of 5 μm formed by providing surfaces of polystyrene-core particles with a nickel layer 0.2 μm thick and forming a gold layer 0.04 μm thick over the outside of the nickel layer. The coating solution obtained in this manner was applied onto a PET film with a surface-treated side 80 μm thick by a coater and dried with hot air at 70° C. for ten minutes. Obtained in this manner was the circuit-connection adhesive film (in the width of 15 cm and the length of 60 m) having the adhesive layer in the thickness of 20 μm. The resultant adhesive film was cut into the width of 1.5 mm and wound by 50 m around a side face (1.5 mm thick) of a plastic reel with the inside diameter of 40 mm and the outside diameter of 48 mm while keeping the adhesive film surface inside, to obtain the circuit-connection adhesive film of tape shape. The temporary fixing power of the obtained circuit-connection adhesive film to the flexible substrate was 110 N/m. The temporary fixing power of the circuit-connection adhesive film to the flexible substrate was measured by the method as described previously.

(Connection of Circuits) The circuit-connection adhesive film of tape shape prepared in Example 1 was kept still at room temperature for three days, and thereafter the desired adhesive film was able to be drawn out of the reel, without back transfer of the adhesive film layer onto the base film.

Then the adhesive surface of the circuit-connection adhesive film (in the width of 1.5 mm and the length of 3 cm) was transferred onto an ITO-coated glass substrate by heat and pressure under the conditions of 70° C. and 1 MPa for three seconds, and the PET film was peeled off. The number of samples prepared was 20, and all the circuit-connection adhesive films (width 1.5 mm and length 3 cm) were successfully transferred onto the ITO-coated glass substrate. Then a flexible printed circuit board (FPC) having six hundred tinned copper circuits in the pitch of 50 μm and in the thickness of 18 μm was pressed onto the circuit-connection film under the conditions of 24° C. and 0.5 MPa for five seconds to be temporarily fixed. All the temporarily fixed FPCs (the number of samples: 20) did not drop even with vertical and lateral vibration together with the glass substrate and had no problem in transportation for placement onto a main bonder being the next process. Then the glass substrate on which the FPC was temporarily fixed by the circuit-connection film was set on the main bonder and was heated and pressed under the conditions of 160° C. and 3 MPa for ten seconds by a heat tool from the flexible circuit board side to effect connection in the width of 2 mm.

(Measurement of Connection Resistance) After the connection of circuits, the resistance between adjoining circuits of the FPC including the above connection part was measured with a multimeter at the beginning and at the time after held in a high-temperature high-humidity chamber of 85° C. and 85% RH for 1000 hours. The resistance was defined as an average of resistances measured at 50 points between adjoining circuits.

The initial connection resistance of the circuit connection structure using the circuit-connection adhesive film obtained in Example 1 was 1.5Ω in average, and the resistance after the 1000 h high-temperature high-humidity (85° C. and 85% RH) test was 2.5Ω in average. Therefore, there was little change in the connection resistance, so as to ensure high connection reliability.

(Measurement of Bond Strength) After the connection of circuits, the bond strength was measured by 90-degree peeling at the peel speed of 50 mm/min. The circuit connection structure in Example 1 demonstrated the good bond strength of about 1000 gf/cm.

Comparative Example 1

A circuit-connection adhesive film with an adhesive layer 20 μm thick was prepared in the same manner as in Example 1 except that 45 parts by weight of bis(acryloxyethyl) isocyanurate having the viscosity at 25° C. of 8,000 mPa·s and 3 parts by weight of 2-methacryloyloxy ethyl acid phosphate were used as the radically polymerizable substance. The temporary fixing power of the circuit-connection adhesive film obtained was 20 N/m.

(Connection of Circuits) The circuit-connection adhesive film of tape shape prepared in Comparative Example 1 was kept still at room temperature for three days and even thereafter, the desired adhesive film was successfully drawn out of the reel, without back transfer of the adhesive film layer onto the base film.

Then the adhesive surface of the circuit-connection adhesive film (width 1.5 mm and length 3 cm) of tape shape was transferred onto an ITO-coated glass substrate by heating and pressing under the conditions of 70° C. and 1 MPa for three seconds, and the peeling test of the PET film was conducted. However, eight samples out of twenty samples failed to transfer the circuit-connection adhesive film onto the ITO-coated glass substrate. Then, using twelve samples which achieved successful transfer of the circuit-connection adhesive film onto the ITO-coated glass substrate, a flexible printed circuit board (FPC) having six hundred tinned copper circuits in the pitch of 50 μm and in the thickness of 18 μm was pressed onto the circuit-connection adhesive film under the conditions of 24° C. and 0.5 MPa for five seconds to be temporarily fixed. Then the glass substrates (twelve samples) in which the FPC was temporarily fixed by the circuit-connection adhesive film were moved to be set on the main bonder, but seven FPCs peeled off the circuit-connection adhesive film because of vibration during transportation and were thus not brought to main bonding.

Comparative Example 2

A circuit-connection adhesive film with an adhesive layer 20 μm thick was prepared in the same manner as in Example 1, except that 45 parts by weight of dimethylol tricyclodecane diacrylate having the viscosity at 25° C. of 150 mPa·s, and 3 parts by weight of 2-methacryloyloxy methacryloyloxy ethyl acid phosphate were used as the radically polymerizable substance. The temporary fixing power of the circuit-connection adhesive film obtained was 200 N/m.

(Connection of Circuits) The circuit-connection adhesive film of tape shape prepared in Comparative Example 2 had too strong tackiness, and had the problem that after kept still at room temperature for three days, the adhesive film layer was back-transferred onto the base film and the desired adhesive film was not successfully drawn out of the reel, resulting in failure in being fed to connection of circuits.

Comparative Example 3

A circuit-connection adhesive film with an adhesive layer 20 m thick was prepared in the same manner as in Example 1, except that 45 parts by weight of triethylene glycol diacrylate having the viscosity at 25° C. of 10 mPa·s and 3 parts by weight of 2-methacryloyloxy ethyl acid phosphate were used as the radically polymerizable substance. The temporary fixing power of the circuit-connection adhesive film obtained was 230 N/m.

(Connection of Circuits) The circuit-connection adhesive film of tape shape prepared in Comparative Example 3 had too strong tackiness and thus had the problem that after kept still at room temperature for three days, the adhesive film layer was back-transferred onto the base film and the desired adhesive film was not successfully drawn out of the reel, thus resulting in failure in being fed to connection of circuits.

The results of above Example 1 and Comparative Examples 1-3 confirmed that the circuit-connection adhesive film of the present invention has excellent connection processability with the flexible substrate.

As described above, the circuit-connection adhesive film of the present invention is able to implement both the satisfactory transferability and temporary fixing power onto the flexible substrate as a circuit member, which were not achieved by the radical curing type circuit-connection adhesive films, and has the excellent connection processability in connection between circuit members.

Since the adhesive film has the excellent connection processability with the flexible substrate, the circuit connection structure of the present invention improves productivity and enables reduction of cost.

What is claimed is:

1. A temporary circuit connection structure before curing process, comprising:
    at least one of a first circuit member having a first circuit electrode;
    a second circuit member having a flexible substrate and a second circuit electrode; and
    a circuit connection member including an uncured adhesive film for circuit connection comprising:
        a curing agent to generate free radicals with heating;
        radically polymerizable substances including (a) urethane acrylate and/or urethane methacrylate having a viscosity at 25° C. in a range of 100,000 mPa·s to 1,000,000 mPa·s, and (b) acrylate and/or methacrylate having dicyclopentenyl group and/or tricyclodecanyl group; and
        a film-forming polymer,
    wherein a temporary fixing power of said uncured adhesive film to the flexible substrate having the circuit electrode is 40-180 N/m.

2. The temporary circuit connection structure according to claim 1, wherein the curing agent is an organic peroxide whose temperature for the half-life of 10 hours is not less than 40° C. and whose temperature for the half-life of 1 minute is not more than 180° C.

3. The temporary circuit connection structure according to claim 2, wherein an amount of the organic peroxide formulated is 0.05-10% by weight.

4. The temporary circuit connection structure according to claim 1, wherein the film-forming polymer is contained in an amount of 80-180 parts by weight, relative to 100 parts by weight of the radically polymerizable substance.

5. The temporary circuit connection structure according to claim 1, wherein a molecular weight of the film-forming polymer is 10,000-1,000,000.

6. The temporary circuit connection structure according to claim 1, further comprising electrically conductive particles included in the circuit connection member.

7. The temporary circuit connection structure according to claim 6, wherein the electrically conductive particles have a coating layer of a noble metal on a transition metal and wherein a thickness of the coating layer is not less than 30 nm.

8. The temporary circuit connection structure according to claim 1, further comprising a filler within a range of 5 to 60% by volume.

9. The temporary circuit connection structure according to claim 1, wherein said (a) urethane acrylate and/or urethane methacrylate has a viscosity at 25° C. in a range of 100,000 mPa·s to 500,000 mPa·s.

10. The temporary circuit connection structure according to claim 1, wherein said (b) acrylate and/or methacrylate comprise diacrylate.

11. The temporary circuit connection structure according to claim 1, wherein said (b) acrylate and/or methacrylate comprise dimethylol tricyclodecane diacrylate.

12. The temporary circuit connection structure according to claim 1, wherein said (b) acrylate and/or methacrylate exhibit Tg of not less than 100° C.

13. A temporary circuit connection structure before curing process, comprising:
- a first circuit member in which a first circuit electrode is formed on a first circuit substrate;
- a second circuit member in which a second circuit electrode is formed on a second circuit substrate, wherein at least one of the first circuit member and the second circuit member is a flexible substrate; and
- a circuit connection member placed between the first circuit electrode and the second circuit electrode and connecting the first and second circuit members to each other, wherein the circuit connection member is an uncured adhesive film for circuit connection comprising:
  - a curing agent to generate free radicals with heating;
  - radically polymerizable substances including (a) urethane acrylate and/or urethane methacrylate having a viscosity at 25° C. in a range of 100,000 mPa·s to 1,000,000 mPa·s and (b) acrylate and/or methacrylate having dicyclopentenyl group and/or tricyclodecanyl group; and
  - a film-forming polymer,
- wherein a temporary fixing power of said uncured adhesive film to the flexible substrate having the circuit electrode is 40-180 N/m, and
- wherein the first circuit electrode and the second circuit electrode are electrically connected through the circuit connection member.

14. The temporary circuit connection structure according to claim 13, wherein the curing agent is an organic peroxide whose temperature for the half-life of 10 hours is not less than 40° C. and whose temperature for the half-life of 1 minute is not more than 180° C.

15. The temporary circuit connection structure according to claim 14, wherein an amount of the organic peroxide formulated is 0.05-10% by weight.

16. The temporary circuit connection structure according to claim 13, wherein the film-forming polymer is contained in an amount of 80-180 parts by weight, relative to 100 parts by weight of the radically polymerizable substance.

17. The temporary circuit connection structure according to claim 13, wherein a molecular weight of the film-forming polymer is 10,000-1,000,000.

18. The temporary circuit connection structure according to claim 13, further comprising electrically conductive particles included in the circuit connection member.

19. The temporary circuit connection structure according to claim 18, wherein the electrically conductive particles have a coating layer of a noble metal on a transition metal and wherein a thickness of the coating layer is not less than 30 nm.

20. The temporary circuit connection structure according to claim 13, further comprising a filler within a range of 5 to 60% by volume.

21. The temporary circuit connection structure according to claim 13, wherein said (a) urethane acrylate and/or urethane methacrylate has a viscosity at 25° C. in a range of 100,000 mPa·s to 500,000 mPa·s.

22. The temporary circuit connection structure according to claim 13, wherein said (b) acrylate and/or methacrylate comprise diacrylate.

23. The temporary circuit connection structure according to claim 13, wherein said (b) acrylate and/or methacrylate comprise dimethylol tricyclodecane diacrylate.

24. The temporary circuit connection structure according to claim 13, wherein said (b) acrylate and/or methacrylate exhibit Tg of not less than 100° C.

* * * * *